United States Patent
Eto et al.

(10) Patent No.: US 6,630,850 B2
(45) Date of Patent: Oct. 7, 2003

(54) SEMICONDUCTOR INTEGRATED CIRCUIT INCLUDING COMMAND DECODER FOR RECEIVING CONTROL SIGNALS

(75) Inventors: Satoshi Eto, Kawasaki (JP); Satoru Saitoh, Kawasaki (JP); Shinichi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/538,721

(22) Filed: Mar. 30, 2000

(65) Prior Publication Data

US 2003/0160645 A1 Aug. 28, 2003

(30) Foreign Application Priority Data

May 7, 1999 (JP) .......................................... 11-126715

(51) Int. Cl.[7] .................................................. H03L 7/00
(52) U.S. Cl. ......................................... 327/141; 327/161
(58) Field of Search ................................ 327/141, 158, 327/159, 161–163; 375/354, 375

(56) References Cited

U.S. PATENT DOCUMENTS

| | | | | |
|---|---|---|---|---|
| 5,313,501 A | * | 5/1994 | Thacker ....................... | 375/117 |
| 5,621,774 A | * | 4/1997 | Ishibashi et al. ............. | 375/371 |
| 5,703,831 A | * | 12/1997 | Sawada ........................ | 365/233 |
| 5,712,882 A | * | 1/1998 | Miller .......................... | 375/356 |
| 5,818,890 A | * | 10/1998 | Ford et al. ................... | 327/277 |
| 6,133,861 A | * | 10/2000 | Jusuf et al. .................. | 327/157 |

* cited by examiner

Primary Examiner—Kenneth B. Wells

(57) ABSTRACT

A delay circuit and a plurality of accepting circuits are comprised. The input signal supplied from exterior is delayed for a predetermined length of time by the delay circuit, and then it is distributed and output to the plurality of the receiver circuits. The delay time of the delay circuit is adjusted to optimize an accepting timing to an input signal by a clock signal in each of the accepting circuit. The each accepting circuit reliably accepts the delayed input signal respectively in synchronization with a clock signal. Therefore, it is unnecessary to respectively provide a delay circuit in the plurality of the accepting circuits. As a result, the plurality of accepting circuits can reliably accept input signals without enlarging a circuit scale. A plurality of delay circuits, a plurality of accepting circuits, and an operating circuit are comprised. The delay circuit receives a plurality of input signals, and outputs each of the delayed input signals respectively to the plurality of accepting circuits. The accepting circuit accepts the delayed input signals in synchronization with a clock signal. More than one of the delayed input signals are supplied to the operating circuit to perform a logic operation. The delay time of the each delay circuit, for example, is in accordance with the supplying timing to the input signal supplied to the operating circuit. As a result, the operating circuit performs the logic operation with a sufficient timing margin.

16 Claims, 18 Drawing Sheets

SEMICONDUCTOR INTEGRATED CIRCUIT INCLUDING COMMAND DECODER FOR RECEIVING CONTROL SIGNALS

BACKGROUND OF THE INVENTION

1. Field of the Invention

The present invention relates to semiconductor integrated circuits, and more particularly to a semiconductor integrated circuit which operates so as to accept input signals in synchronization with a clock signal.

2. Description of the Related Art

In general, semiconductor integrated circuits are broadly classified into logic LSIs, such as a microcomputer, and memory LSIs, such as a DRAM. The microcomputer has been widely known as a semiconductor integrated circuit which operates in synchronization with a clock. On the other hand, in the memory LSIs, an SDRAM (Synchronous DRAM) or the like operating in synchronization with a clock has been developed.

In the SDRAM, an interfacing circuit is operated at high speed in synchronization with a clock signal supplied from the exterior of the SDRAM, so that writing or reading data at high speed is made possible while timing margins are kept.

FIG. 1 shows the block diagram of an input interfacing circuit 1 in the semiconductor integrated circuit of this kind. The input interfacing circuit 1 includes a clock buffer 2, a plurality of input buffers 3a, 3b, 3c, and a plurality of input signal accepting circuits 4a, 4b, 4c. Each of the input signal accepting circuits 4a, 4b, 4c includes a latch 5. The clock buffer 2 is supplied with a clock signal CLK from the exterior of a chip. This clock buffer 2 decides the signal level of the clock signal CLK, converts the clock signal CLK into an internal clock signal CLKIN of high level or low level, and outputs the internal clock signal CLKIN to the respective input signal accepting circuits 4a, 4b, 4c. The input buffers 3a, 3b, 3c are respectively supplied with input signals S1, S2, S3 from the exterior of the chip. These input buffers 3a, 3b, 3c decide the signal levels of the input signals S1, S2, S3, convert the input signals S1, S2, S3 into internal signals SIN1, SIN2, SIN3 of high level or low level, and output the internal signals SIN1, SIN2, SIN3 to the input signal accepting circuits 4a, 4b, 4c, respectively. The latches 5 accept the internal signals SIN1, SIN2, SIN3 in synchronization with the edge of the internal clock signal CLKIN, and output accepted signals SIN1A, SIN2A, SIN3A to a controlling circuit 6, or the like within the chip, respectively. In the figure, lines indicated by arrows denote wiring patterns, and the directions of the arrows denote the directions in which the signals are transmitted.

In the input interfacing circuit 1 described above, ordinarily the input buffers 3a, 3b, 3c are arranged near pads for receiving the signals from the exterior of the chip and are dispersed on the chip. In contrast, the input signal accepting circuits 4a, 4b, 4c are arranged at the predetermined position on the chip. Therefore, the wiring patterns which are respectively laid to transmit the internal signals SIN1, SIN2, SIN3 between the input buffers 3a, 3b, 3c and the input signal accepting circuits 4a, 4b, 4c can not have the same lengths. By way of example, the wiring pattern for transmitting the internal signal SIN1 is the shortest, and the wiring pattern for transmitting the internal signal SIN3 is the longest. Since the propagation delay time of each signal is proportional to the length of the wiring pattern, the internal signals SIN1, SIN2, SIN3 are respectively supplied to the input signal accepting circuits 4a, 4b, 4c at timings different from one another.

As a result, the timings of the respective latches 5 for accepting the internal signals SIN1, SIN2, SIN3 shift as shown in FIG. 2. In the example of FIG. 2, the signal in which a timing margin for a set-up time tS is the smallest is the internal signal SIN3, and the signal in which a timing margin for a hold time tH is the smallest is the internal signal SIN1. Here, the "set-up time tS" is the specification of the minimum time in which the input signal needs to be settled before the rise of the clock signal CLK, and the "hold time tH" is the specification of the minimum time in which the input signal needs to be held after the rise of the clock signal CLK. Besides, in general, the ratings of external input terminals for the set-up time tS and the hold time tH are specified by the worst value of all input signals. For this reason, when the accepting timings of the internal signals SIN1, SIN2, SIN3 fluctuates, the timing margins of the external input terminals for the set-up time tS and the hold time tH become short.

The specifications of the set-up time tS and the hold time tH need to be made more strict as the frequency of the clock signal CLK becomes higher. In the SDRAM of high speed operation, therefore, the input signal accepting circuits 4a, 4b, 4c are respectively furnished with delay circuits 7a, 7b, 7c on the input sides of the latches 5 as shown in FIG. 3, thereby to lower the fluctuation of the timings of the internal signals SIN1, SIN2, SIN3. In the figure, the sizes of the delay circuits 7a, 7b, 7c express the lengths of delay times. The delay circuits 7a, 7b, 7c are respectively adjusted in accordance with the delays of the internal signals SIN1, SIN2, SIN3 attributed to the unequal lengths of the wiring patterns, and the timings at which the internal signals SIN1, SIN2, SIN3 are respectively transmitted to the latches 5 are set same. In consequence, the set-up times tS and hold times tH of all the internal signals SIN1, SIN2, SIN3 are equalized.

Meanwhile, in an SDRAM or the like, the combinations of the signal levels of a plurality of input signals received in synchronization with a clock signal CLK are decided as a plurality of controlling commands, by which an internal circuit is controlled.

As shown in FIG. 4, the input interfacing unit 1 of the SDRAM of this type is formed with a decoder 8 which receives accepted signals SIN1A, SIN2A, SIN3A output from respective latches 5, and which outputs a command signal CMD.

With the circuit shown in FIG. 4, the output of the command signal CMD delayed because the internal signals SIN1A, SIN2A, SIN3A accepted by the corresponding latches 5 are decoded by the decoder 8. As a result, the operation of a controlling circuit 6 delays, and an access time, or the like cannot be enhanced. In order to quicken the output of the command signal CMD, internal signals SIN1, SIN2, SIN3 before being accepted by the latches 5 should be decoded.

Each of FIGS. 5 and 6 shows the construction of the principal parts of an input interfacing unit 1 which serves to decode the internal signals SIN1, SIN2, SIN3 before being accepted by the latches 5, and which has been thought out by the inventors of the present invention.

The input interfacing unit 1 shown in FIG. 5 is formed with a command accepting unit 9 which includes a decoder 10, a delay circuit 7d and a latch [circuit] 5. The decoder 10 receives the internal signals SIN1, SIN2, SIN3, and outputs a command signal CMD to the delay circuit 7d. The delay circuit 7d outputs the delayed command signal to the latch 5. The latch 5 accepts the delayed command signal CMD in synchronization with an internal clock signal CLKIN, and outputs the accepted signal to the controlling circuit 6 as a command signal CMD1. Here, the delay circuit 7d is a circuit for adjusting the timings of the command signal CMD and the internal clock signal CLKIN which are supplied to the latch 5.

The input interfacing unit 1 shown in FIG. 6 is formed with a command accepting unit 11 which includes delay circuits 7e, 7f, 7g, a decoder 10 and a latch 5. The decoder 10 receives the internal signals SIN1, SIN2, SIN3 through the delay circuits 7e, 7f, 7g, respectively, and outputs a command signal CMD to the latch 5. The latch 5 accepts the command signal CMD in synchronization with an internal clock signal CLKIN, and outputs the accepted signal to the controlling circuit 6 as a command signal CMD1.

It is added that the input interfacing units 1 shown in FIGS. 5 and 6 are not known yet.

With the input interfacing unit 1 shown in FIG. 5, the command signal CMD has its width W narrowed by the decoder 10 as shown in FIG. 7. This incurs the problem that the timing margins of the command signal CMD for the set-up time tS and the hold time tH become small in the latch 5.

SUMMARY OF THE INVENTION

An object of the present invention is to provide a semiconductor integrated circuit which can reliably receive input signals without enlarging the circuit scale.

Another object of the present invention is to provide a semiconductor integrated circuit where an internal circuit can be quickly and reliably operated.

Still another object of the present invention is to set an optimal delay time of an input signal.

According to one of the aspects of the semiconductor integrated circuit in the present invention, the semiconductor integrated circuit comprises a delay circuit and a plurality of receiver circuits. The input signal supplied from the exterior of the integrated circuit is delayed for a predetermined length of time by the delay circuit, and then it is distributed and output to the plurality of the receiver circuits. The delay time of the delay circuit is set so that a receiving timing of an input signal received in synchronization with a clock signal is optimized in each of the receiver circuits. Each receiver circuit reliably receives the delayed input signal respectively in synchronization with a clock signal.

Therefore, it is unnecessary to provide a delay circuit in each of the plurality of receiver circuits. As a result, the plurality of receiver circuits can reliably receive the input signals without enlarging the circuit scale. When there is a need to adjust the delay time of the input signals, only one of the delay circuits needs to be changed.

Generally, in the semiconductor integrated circuit, the delay circuit is constructed by combining a resistor and a capacitor whose sizes are designed according to the lengths and the sizes of wirings, diffusion layers and insulators. This often results in the enlargement of the layout size of a delay circuit as compared to other circuits. The present invention makes it possible to reduce the number of the delay circuits so that the size of each delay circuit can be also be reduced as well as the size of the chip.

According to another aspect of the semiconductor integrated circuit in the present invention, switching the ON/OFF state of a switch provided in the delay circuit enables the transmission path of the input signal to change and its delay time to be adjusted. Therefore, when it is necessary to adjust the delay time of the input signal, only the switch needs to be changed.

According to another aspect of the semiconductor integrated circuit in the present invention, the semiconductor integrated circuit comprises a plurality of delay circuits, a plurality of receiver circuits, and an operating circuit. The delay circuit receives a plurality of input signals, and respectively outputs each of the delayed input signals to the plurality of receiver circuits. The receiver circuit receives the delayed input signals in synchronization with a clock signal. More than one of the delayed input signals are supplied to the operating circuit to perform a logic operation. The delay time of each delay circuit, for example, is set in accordance with the supplying timing to the input signal supplied to the operating circuit. As a result, the operating circuit performs the logic operation with a sufficient timing margin, and the timing margin between the input signals supplied to the operating circuit does not fluctuate, even when the delay time of each delay circuit is relatively shifted. By relatively shifting the delay time of each delay circuit, each receiver circuit becomes capable of reliably receiving the delayed input signal respectively in synchronization with a clock signal. Consequently, the delay circuit is able to supply input signals to both the operating circuit and the receiver circuit at an optimal timing.

According to another aspect of the semiconductor integrated circuit in the present invention, the logical operating circuit is constructed as a command decoder and it comprises a command signal receiver circuit, which receives a command signal output from the command decoder in synchronization with a clock signal.

The command decoder directly receives the input signals delayed by the delay circuits and outputs a command signal controlling the operations of internal circuits. The command signal receiver circuit reliably receives a wide command signal output from the command decoder in synchronization with a clock signal. Since the command signal receiver circuit receives the command signal decoded by the command decoder, an early start can be made in the operations of the internal circuits. Besides, there can be a plurality of command decoders and there can be a common delay circuit between the command decoders, so that the number of the delay circuits is further reduced to also reduce the size of each delay circuit as well as the size of the chip.

According to another aspect of the semiconductor integrated circuit in the present invention, switching the ON/OFF state of the switch enables the transmission path of the input signal to change and its delay time to be adjusted. Therefore, the optimal delay time of the each delay circuit can be set. When it is necessary to adjust the delay time of the input signal, only the switch needs to be changed. The layout data of the elements of the delay circuit other than the switch is made common between each other, so that the layout designing time may be shortened.

The delay time of the each delay circuit is adjusted so that the supply timings to the command decoder are equal between each input signal. This prevents the pulse width of the command decoder from becoming narrower so that the internal circuits can be reliable operated.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

DESCRIPTION OF THE PREFERRED EMBODIMENTS

Now, the embodiments of the present invention will be described with reference to the drawings.

Figure 1:
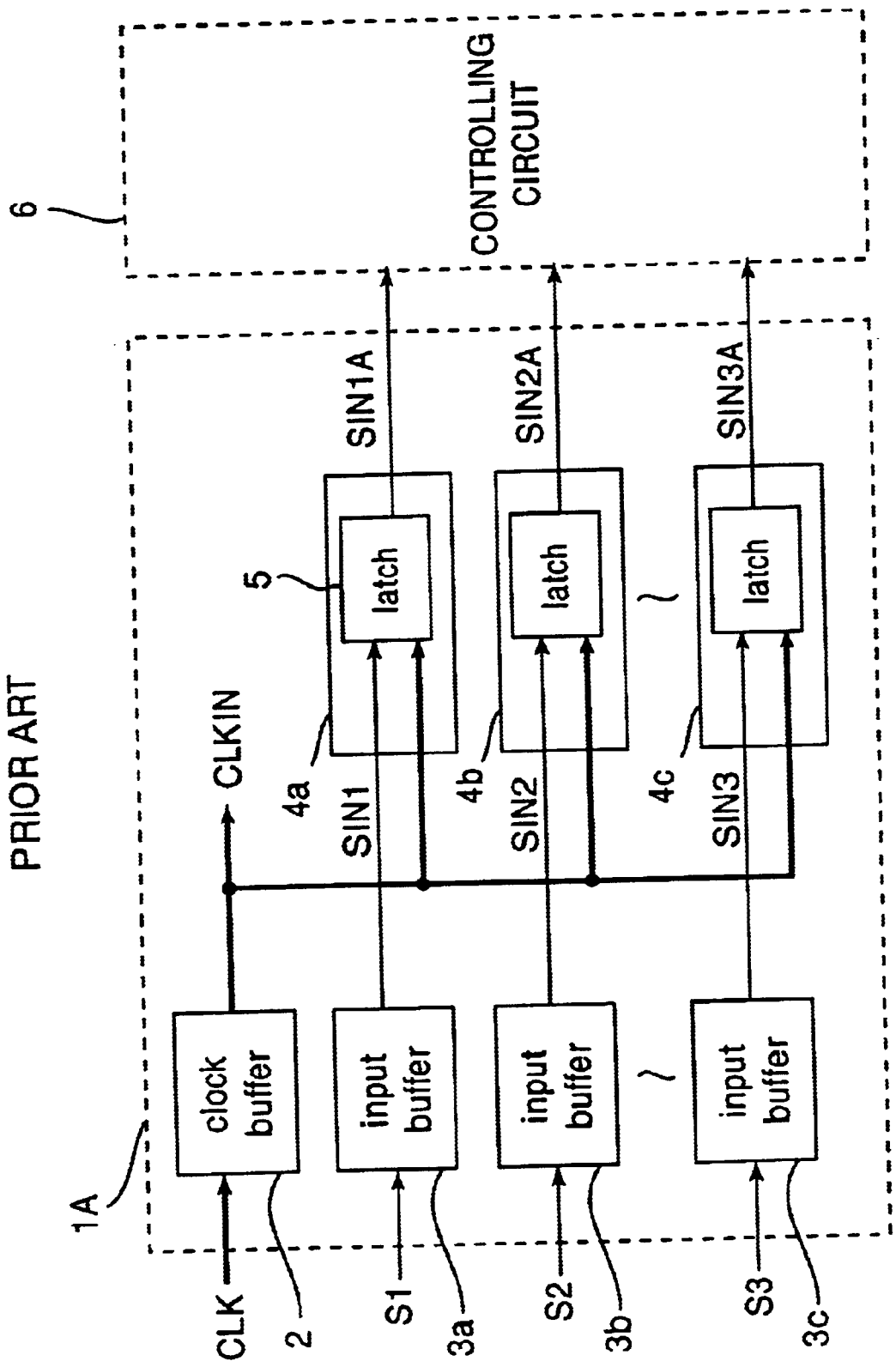
FIG. 1 is a block diagram showing the construction of an input interfacing unit in the prior art semiconductor integrated circuit.
Figure 2:
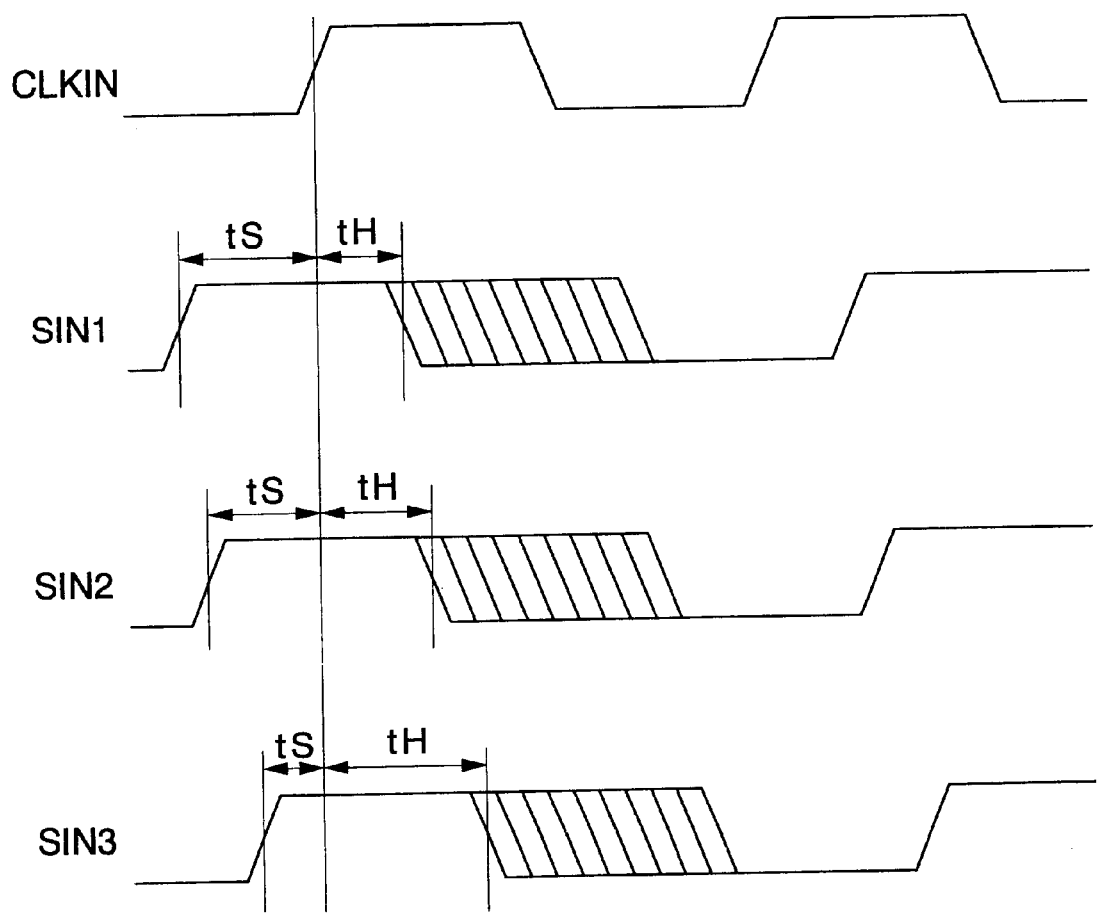
FIG. 2 is a timing chart showing the timings at which internal signals are accepted in the prior art.
Figure 3:
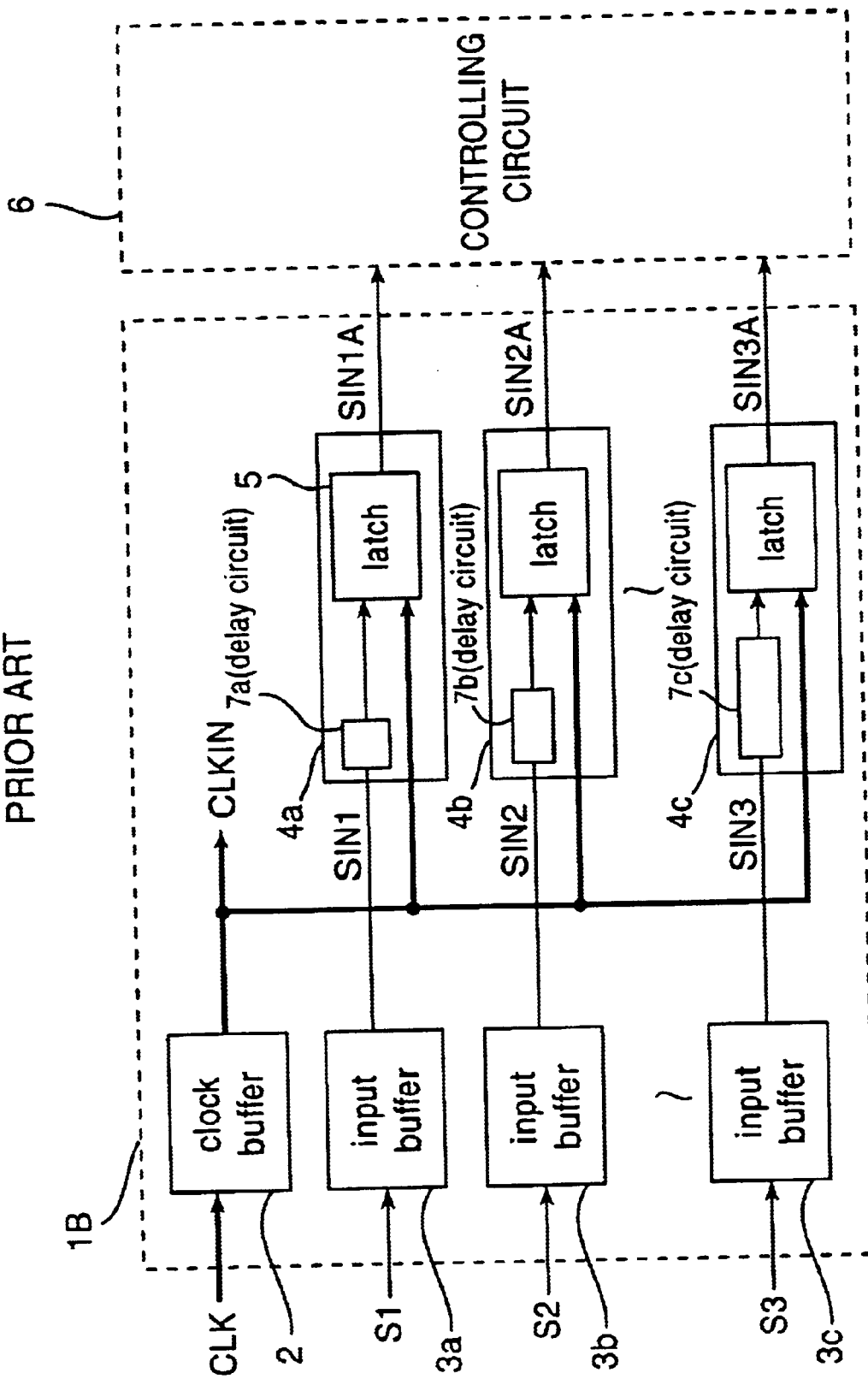
FIG. 3 is a block diagram showing the construction of another input interfacing unit in the prior art semiconductor integrated circuit.
Figure 4:
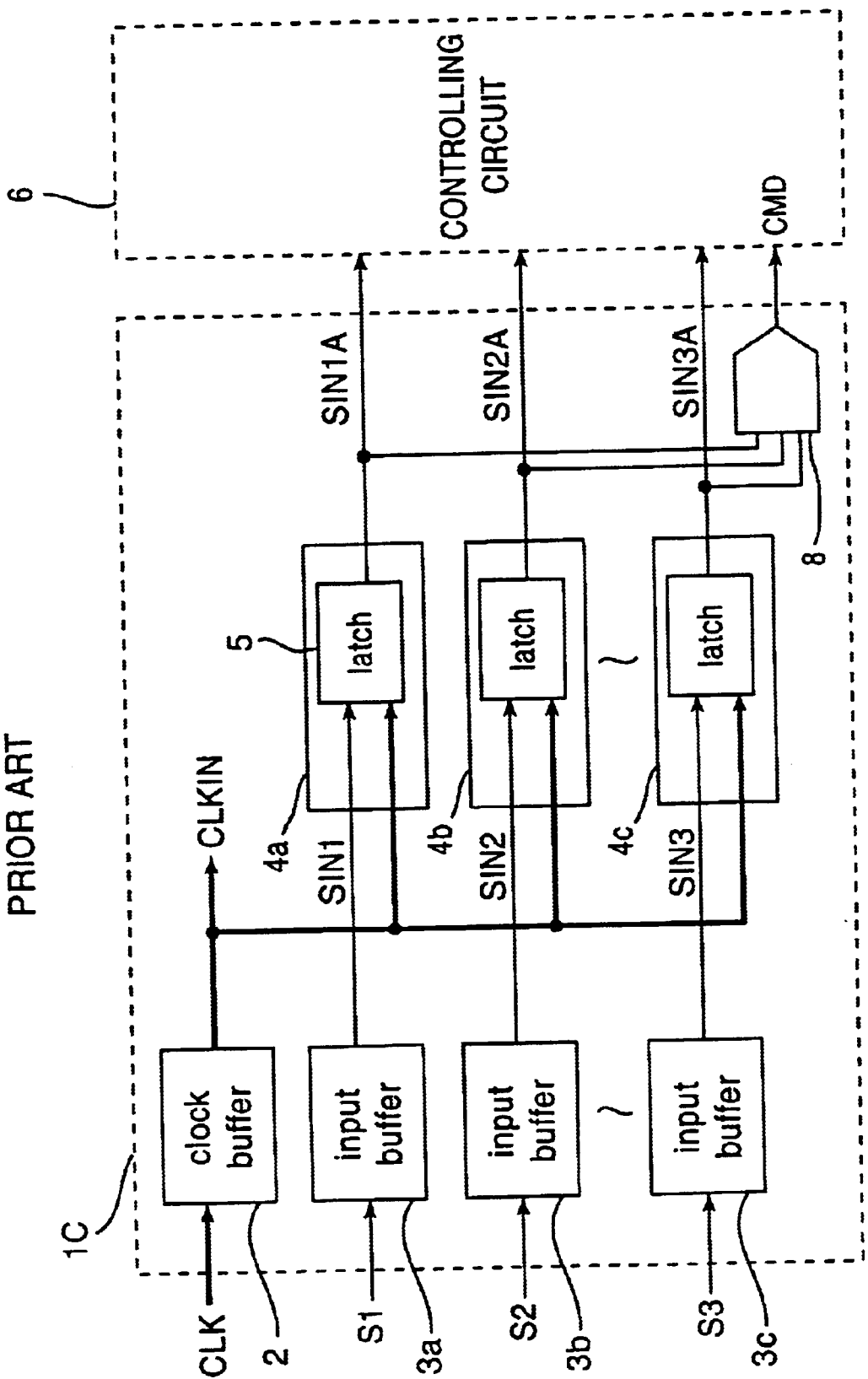
FIG. 4 is a block diagram showing the construction of an input interfacing unit in the prior art semiconductor integrated circuit including a command decoder.
Figure 5:
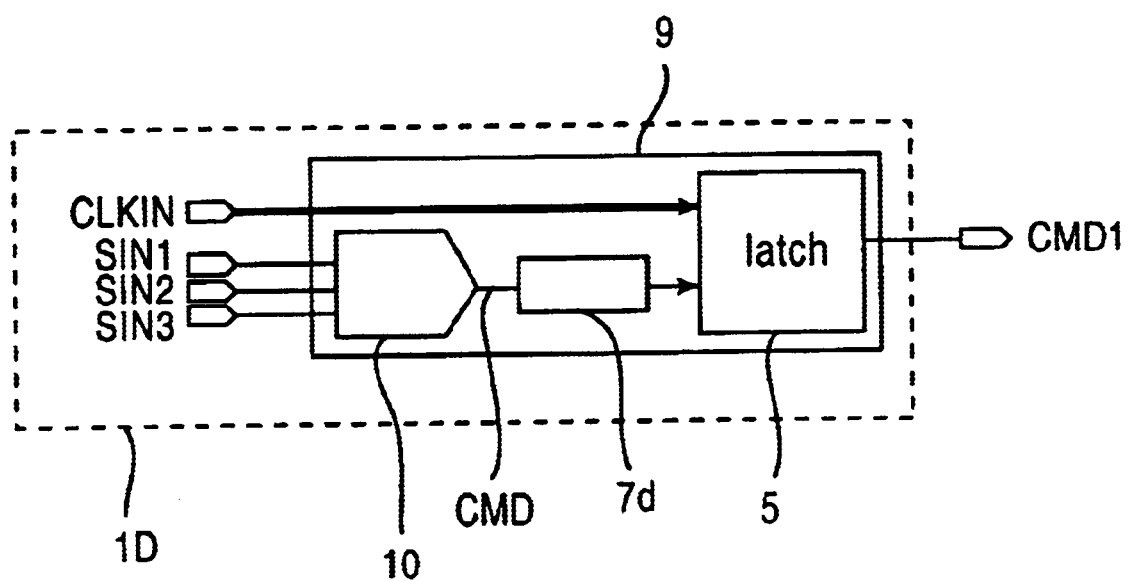
FIG. 5 is a block diagram showing the construction of the principal parts of an input interfacing unit thought out by the inventor of the present invention.
Figure 6:
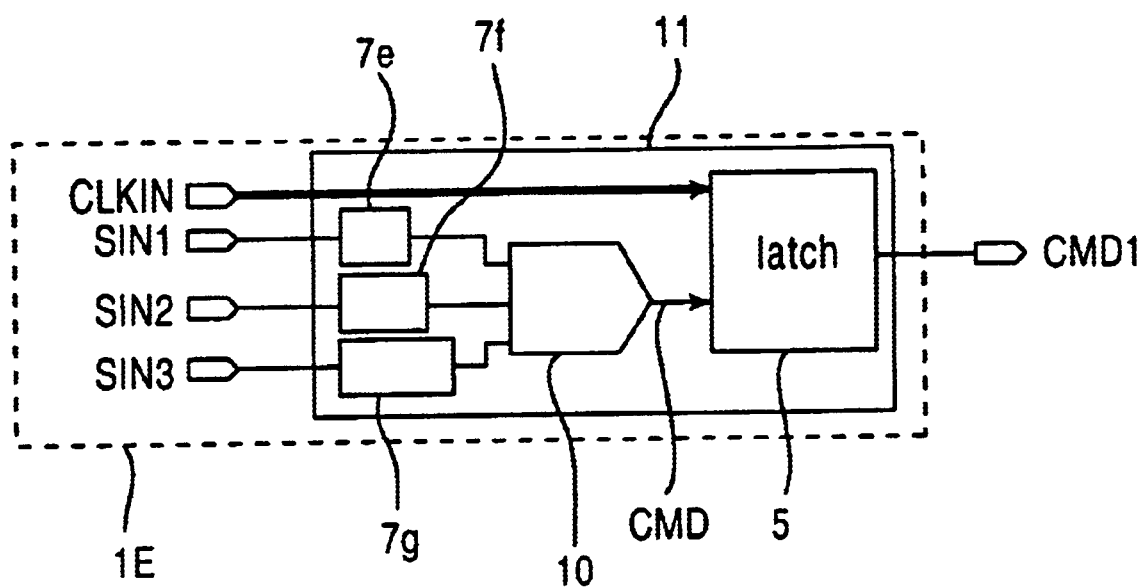
FIG. 6 is a block diagram showing the construction of the principal parts of another input interfacing unit thought out by the inventor.
Figure 7:
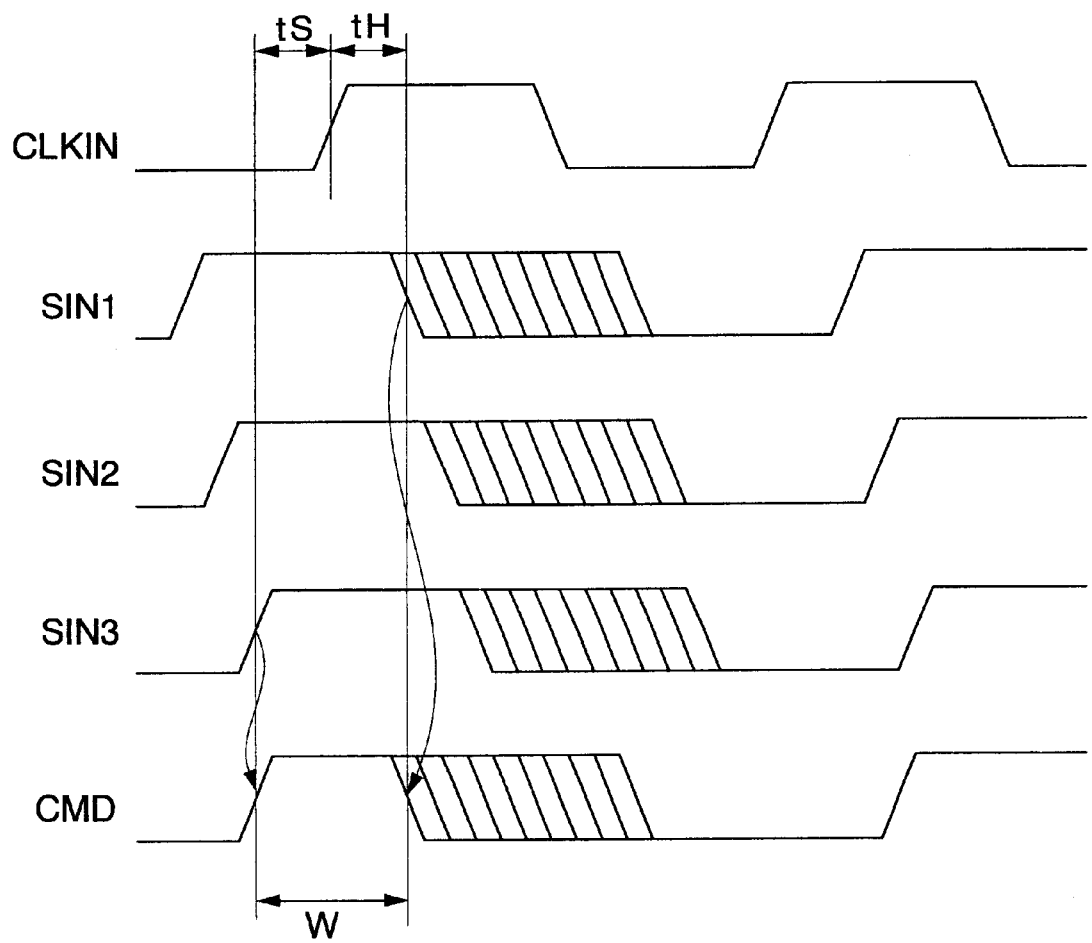
FIG. 7 is a timing chart showing the timing at which a decoded signal is accepted in the input interfacing unit shown in FIG. 5.
Figure 8:
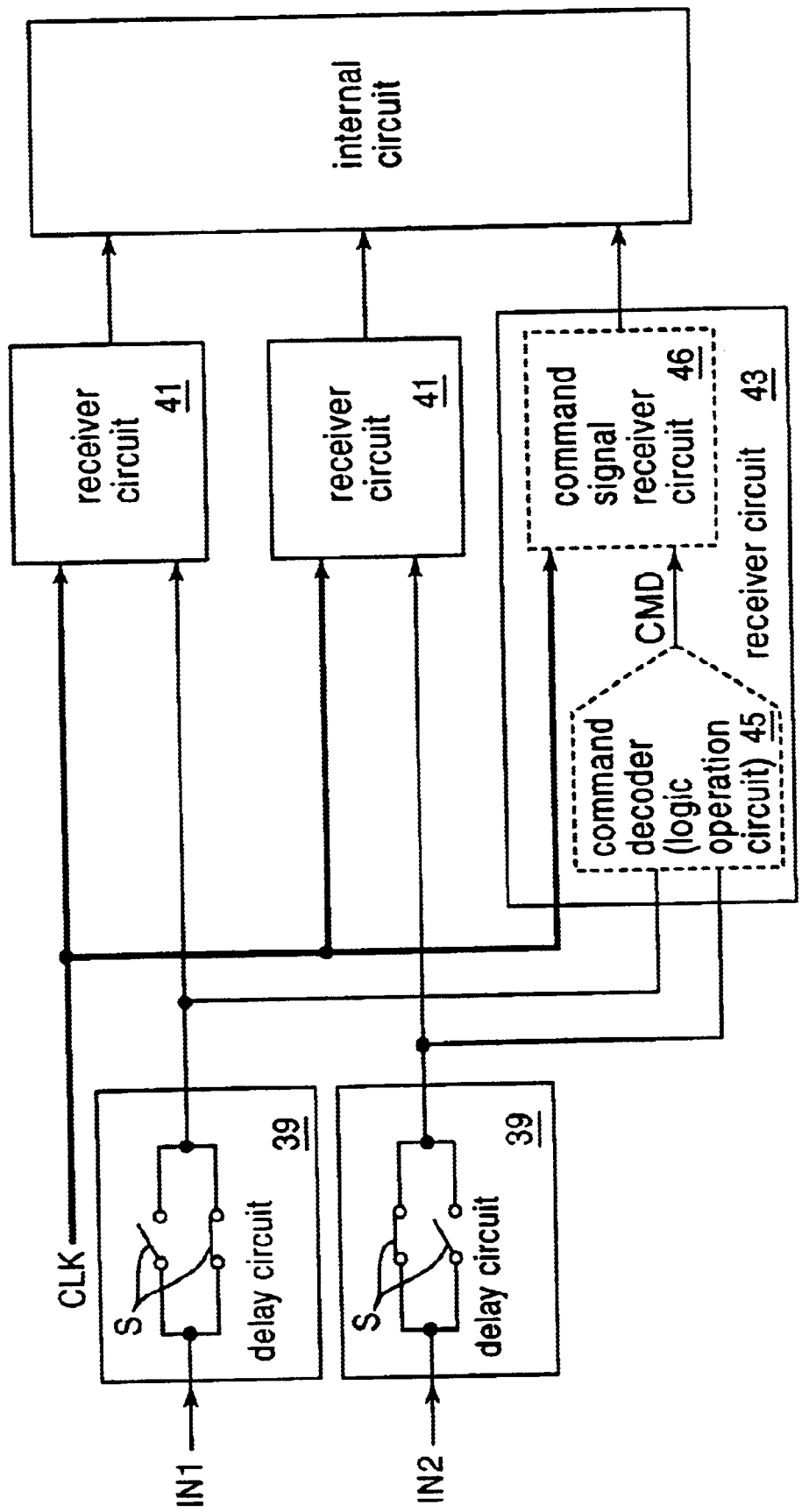
FIG. 8 is a block diagram showing the basic principles of the first embodiment of a semiconductor integrated circuit according to the present invention.

FIG. 8 is a block diagram showing the basic principles of the first embodiment of a semiconductor integrated circuit according to the present invention.

The semiconductor integrated circuit includes a plurality of delay circuits 39 each having switches S, and a plurality of receiver circuits 41, 43. A plurality of input signals IN1, IN2 supplied from the exterior of the integrated circuit, are delayed predetermined time periods by each delay circuit 39, and the delayed signals are distributed and output toward the plurality of receiver circuits 41, 43. The transmission path of each of the input signals IN1, IN2 is altered by changing the ON/OFF states of the switches S included in each delay circuit 39, whereby the delay time is adjusted.

Besides, the receiver circuit 43 includes a logic operating circuit 45 and a command signal receiver circuit 46. The delayed input signals IN1, IN2 (in general, numbering two or more) are supplied to the logical operating circuit 45 so as to perform a logic operation. In this example, the logical operating circuit 45 is constructed as a command decoder. The command decoder 45 directly receives the input signals IN1, IN2 delayed by the delay circuits 39, and outputs a command signal CMD for controlling the operations of internal circuits 23, 25. The command signal receiver circuit 46 receives the command signal CMD output from the command decoder 45, in synchronization with a clock signal CLK.

Figure 9:
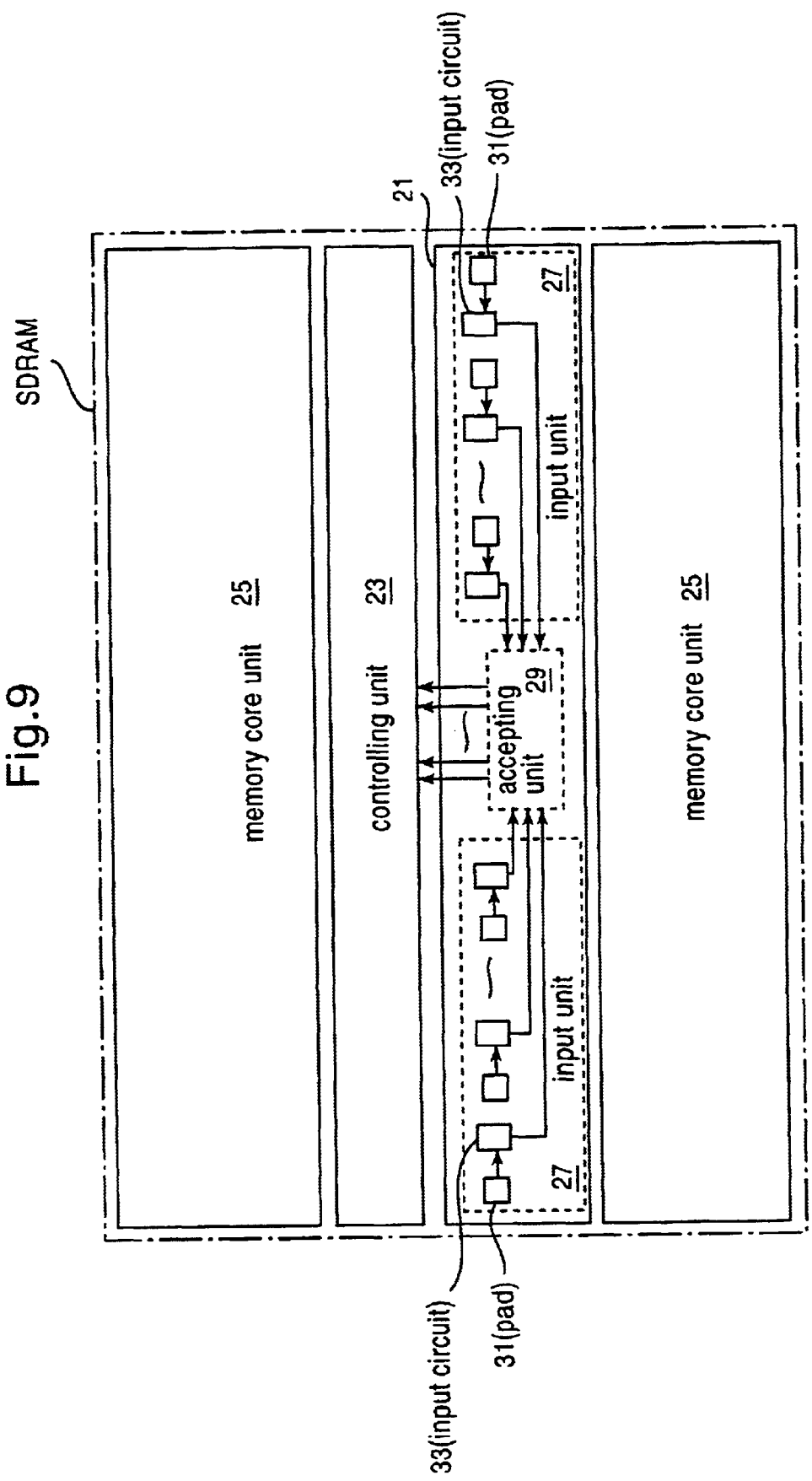
FIG. 9 is a block diagram showing the first embodiment of a semiconductor integrated circuit according to the present invention.

FIG. 9 shows the first embodiment of the semiconductor integrated circuit according to the present invention.

The semiconductor integrated circuit of this embodiment is formed on a silicon substrate as an SDRAM by using CMOS process technology.

The SDRAM includes an input interfacing unit 21, a controlling unit 23 and two memory core units 25. The input interfacing unit 21 is configured of input units 27 arranged as two divided portions, and an accepting unit 29 arranged substantially in the center of a chip. The controlling unit 23 and the memory core units 25 correspond to the internal circuits (23, 25 in FIG. 8). Each of the input units 27 includes a plurality of pads 31 (which correspond to pads 31a, 31b, 31c, 31d to be mentioned below), and a plurality of input circuits 33 (which correspond to input circuits 33a, 33b, 33c, 33d to be mentioned below). In FIG. 9, lines indicated by arrows denote wiring patterns, and the senses of the arrows denote the directions in which signals are transmitted.

Figure 10:
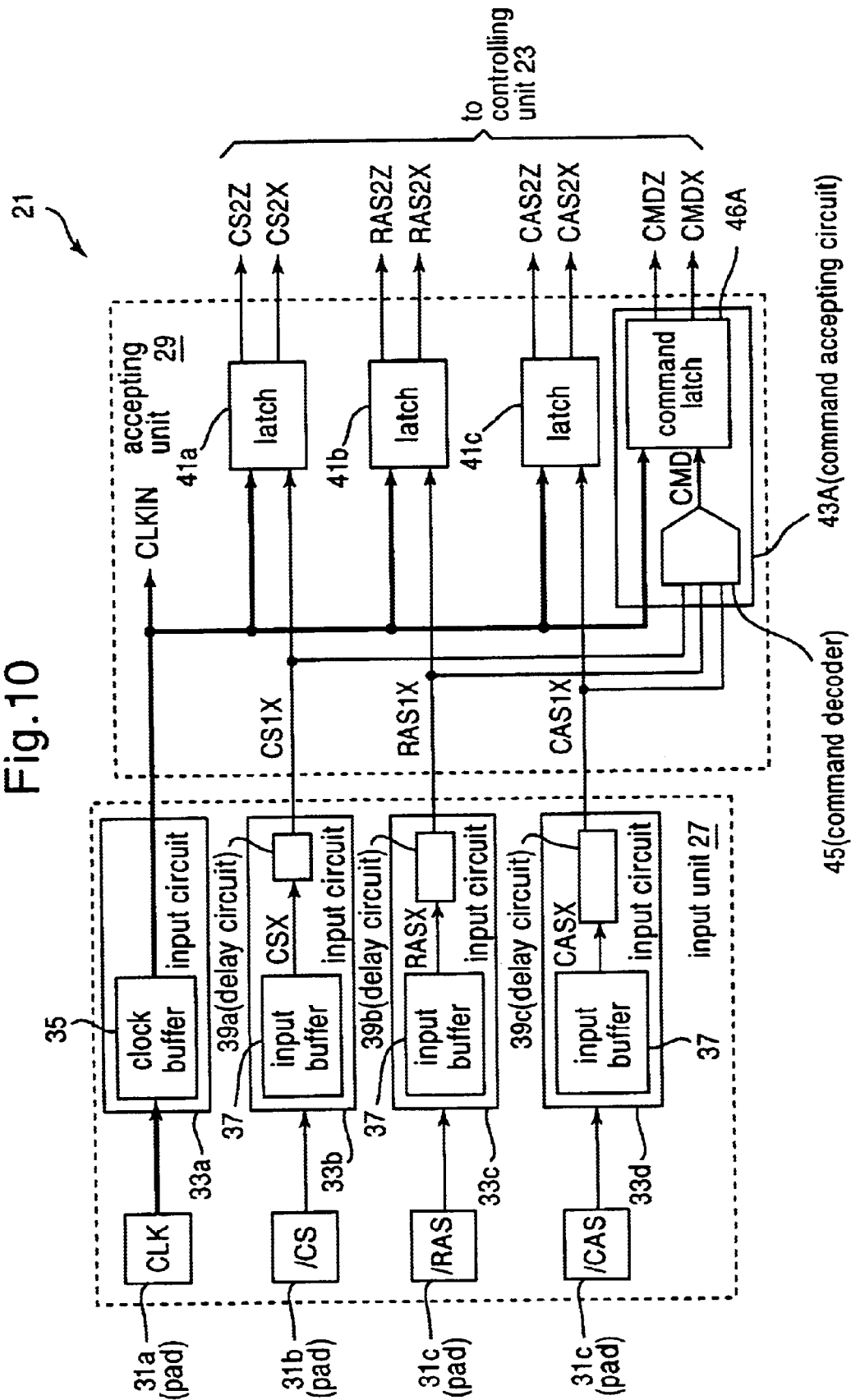
FIG. 10 is a block diagram showing the construction of the principal parts of an input interfacing unit in FIG. 9.

FIG. 10 is a block diagram showing the construction of the principal parts of the input interfacing unit 21. In the figure, only three major input signals are illustrated.

Each of the input units 27 is formed with the pads 31a, 31b, 31c and 31d which receive a clock signal CLK, a chip select signal /CS, a row address strobe signal /RAS and a column address strobe signal /CAS from the exterior of the SDRAM, respectively. The pads 31a, 31b, 31c, 31d are respectively connected to the corresponding input circuits 33a, 33b, 33c, 33d. The input circuit 33a includes a clock buffer 35. The clock buffer 35 decides the signal level of the clock signal CLK supplied through the pad 31a, converts the clock signal CLK into an internal clock signal CLKIN of high level or low level, and outputs the internal clock signal CLKIN to the accepting unit 29.

The input circuit 33b includes an input buffer 37 and a delay circuit 39a. Likewise, the input circuit 33c includes an input buffer 37 and a delay circuit 39b. Also, the input circuit 33d includes an input buffer 37 and a delay circuit 39c.

The input buffer 37 of the input circuit 33b decides the signal level of the chip select signal ICS supplied through the pad 31b, converts the chip select signal ICS into an internal signal CSX of high level or low level, and outputs the internal signal CSX to the delay circuit 39a. Further, the input buffer 37 of the input circuit 33c decides the signal level of the row address strobe signal /RAS supplied through the pad 31c, converts the row address strobe signal /RAS into an internal signal RASX of high level or low level, and outputs the internal signal RASX to the delay circuit 39b. Still further, the input buffer 37 of the input circuit 33d decides the signal level of the column address strobe signal /CAS supplied through the pad 31d, converts the column address strobe signal /CAS into an internal signal CASX of high level or low level, and outputs the internal signal CASX to the delay circuit 39c.

The delay circuits 39a, 39b, 39c delay the internal signals CSX, RASX, CASX for predetermined time periods and output the delayed signals to the accepting circuits (41 in FIG. 8) as delay signals CS1X, RAS1X, CAS1X, respectively. In the figure, the sizes of the delay circuits 39a, 39b, 39c express the delay times. The delay times are determined in accordance with the lengths of wiring patterns by which the respective delay signals CS1X, RAS1X, CAS1X are transmitted to a command decoder 45 to be explained later. Specifically, the delay times of each delay circuits 39a, 39b, 39c are set so as to equalize all of the totals as follows; (1) the total delay time of the delay signal CS1X, due to the wiring pattern, and of the delay circuit 39a, (2) the total delay time of the delay signal RAS1X, due to the wiring pattern, and of the delay circuit 39b, and (3) the total delay time of the delay signal CAS1X, due to the wiring pattern, and of the delay circuit 39c. Simultaneously, the delay times of each delay circuits 39a, 39b, 39c are set so that the set-up times tS and the hold times tH of the signals which are accepted by latches to be explained later can be satisfactorily ensured. In this embodiment, the length of the wiring pattern laid to the command decoder 45 is the longest for the delay signal CS1X and the shortest for the delay signal CAS1X.

The accepting unit 29 includes the latches 41a, 41b, 41c which receive the delay signals CS1X, RAS1X, CAS1X, respectively, and a command accepting circuit 43A which receives all of these delay signals CS1X, RAS1X, CAS1X. The latches 41a, 41b, 41c and the command accepting circuit 43A correspond to the receiver circuits (41, 43 in FIG. 8).

The latch 41a receives the internal clock signal CLKIN and the delay signal CS1X, and outputs internal signals CS2Z, CS2X to the controlling unit 23. Further, the latch 41b receives the internal clock signal CLKIN and the delay signal RAS1X, and it outputs internal signals RAS2Z, RAS2X to the controlling unit 23. Still further, the latch 41c receives the internal clock signal CLKIN and the delay signal CAS1X, and it outputs internal signals CAS2Z, CAS2X to the controlling unit 23. Incidentally, the signals whose symbols end in "Z" are ones of positive logic, and the signals whose symbols end in "X" are ones of negative logic.

The command accepting circuit 43A includes the command decoder 45 and a command latch 46A. The command latch 46A is the same circuit as each of the latches 41a, 41b, 41c. This command latch 46A corresponds to the command signal receiver circuit (46 in FIG. 8).

The command decoder 45 receives the delay signals CS1X, RAS1X, CAS1X, and outputs a command signal CMD. The command latch 46A receives the internal clock signal CLKIN and the command signal CMD, and outputs command signals CMDZ, CMDX to the controlling unit 23. By the way, the latches 41a, 41b, 41c and the command accepting circuit 43A are arranged at near positions within the accepting unit 29.

Figure 11:
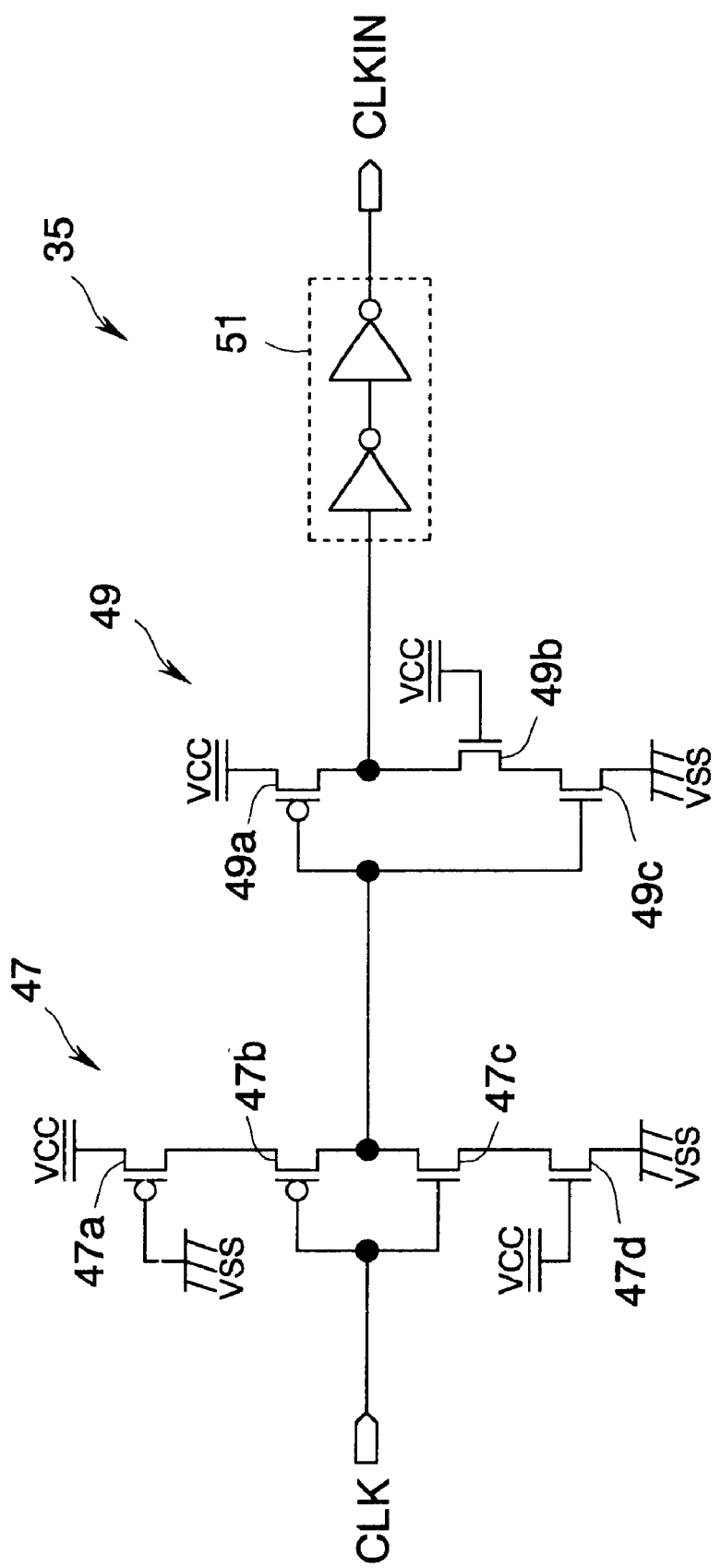
FIG. 11 is a circuit diagram showing the details of a clock buffer in FIG. 10.

FIG. 11 shows the details of the clock buffer 35. The clock buffer 35 is so constructed that two CMOS inverters 47, 49, and an inverter row 51 consisting of two inverters are connected in cascade.

The source of a pMOS (p-channel MOSFET) 47b in the CMOS inverter 47 is connected to a power supply VCC through a pMOS 47a. The gate of the pMOS 47a is connected to the ground VSS. In addition, the source of an nMOS (n-channel MOSFET) 47c in the CMOS inverter 47 is connected to the ground VSS through an nMOS 47d. The gate of the nMOS 47d is connected to the power supply VCC.

The drain of an nMOS 49c in the CMOS inverter 49 is connected to the output node of this inverter through an nMOS 49b. The gate of the nMOS 49b is connected to the power supply VCC. The output node of the CMOS inverter 49 is connected to the inverter row 51, which outputs the internal clock signal CLKIN.

Figure 12:
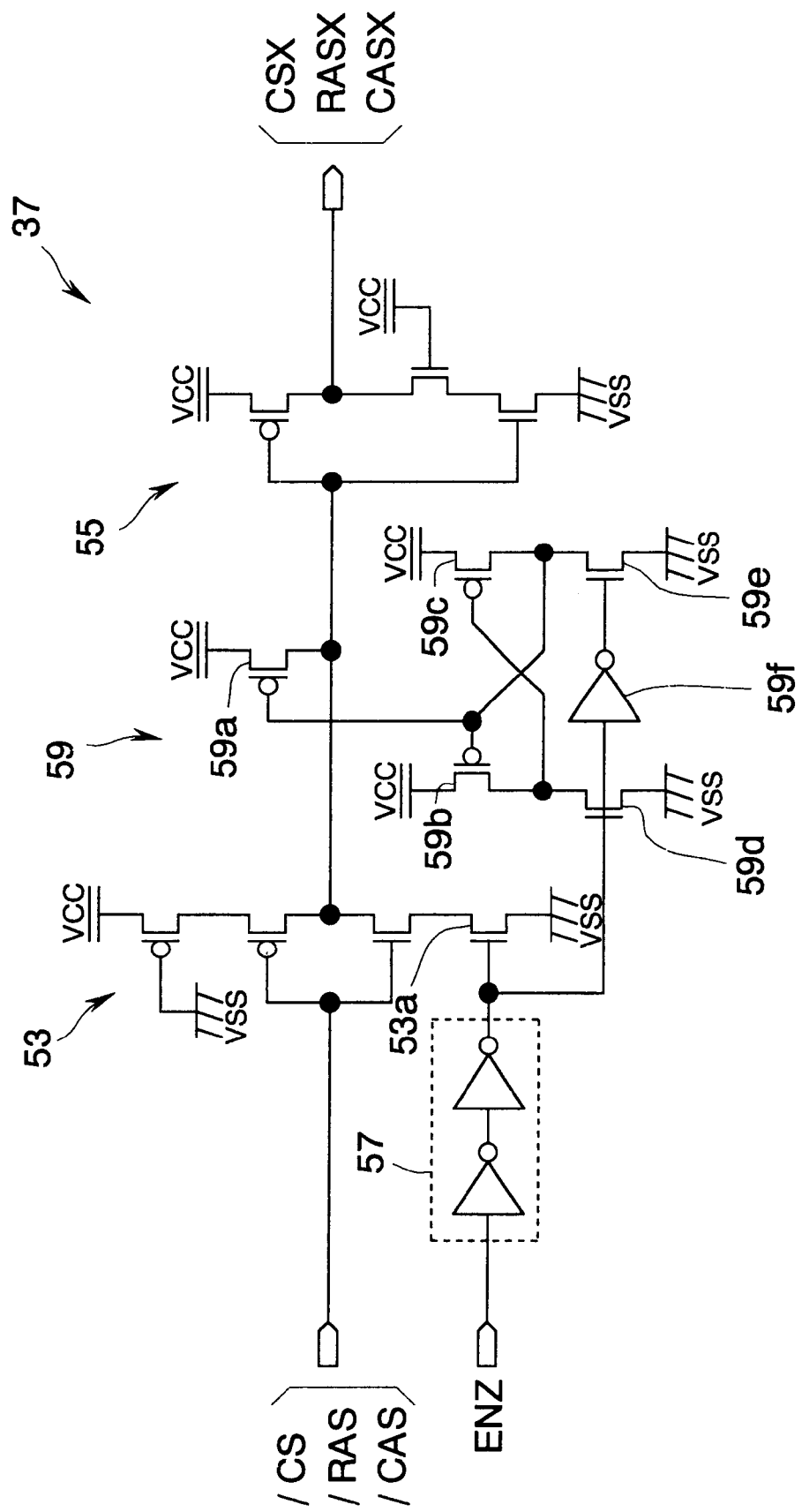
FIG. 12 is a circuit diagram showing the details of each of input buffers in FIG. 10.

FIG. 12 shows the details of each input buffer 37. The input buffer 37 is configured of two CMOS inverters 53, 55 connected in cascade, an inverter row 57 consisting of two inverters, and a controlling circuit 59 for inactivating this input buffer 37. The input buffer 37 receives the one of the chip select signal /CS, row address strobe signal /RAS and column address strobe signal /CAS by means of the CMOS inverter 53, and it outputs one of the internal signals CSX, RASX, CASX from the CMOS inverter 55.

The CMOS inverter 53 is the same as the CMOS inverter 47 of the clock buffer 35 shown in FIG. 11, except that the output node of the inverter row 57 is connected to the gate of an nMOS 53a located on the side of the ground VSS. The CMOS inverter 55 is the same as the CMOS inverter 49 of the clock buffer 35. The input node of the inverter row 57 is supplied with an input activation signal ENZ. The input activation signal ENZ is a signal which becomes a high level during the normal operation of the SDRAM, and which becomes a low level in the low power consumption mode thereof.

The controlling circuit 59 is configured of three pMOSs 59a, 59b, 59c, two nMOSs 59d, 59e, and an inverter 59f. The drain of the pMOS 59a is connected to the output node of the CMOS inverter 53, and the source thereof to the power supply VCC. In addition, the gate of the pMOS 59a is connected to the gate of the pMOS 59b and the drain of the pMOS 59c. The sources of the pMOSs 59b, 59c are connected to the power supply VCC. Besides, the gate of the pMOS 59c is connected to the drain of the pMOS 59b. Further, the drains of the pMOSs 59b, 59c are respectively connected to the drains of the nMOSs 59d, 59e. The sources of the nMOSs 59d, 59e are connected to the ground VSS. The output node of the inverter row 57 is connected to the gate of the nMOS 59d. Also, the output node of the inverter row 57 is connected to the gate of the nMOS 59e through the inverter 59f. The controlling circuit 59 has the function of applying the high level to the input of the CMOS inverter 55 through the pMOS 59a when the input activation signal ENZ is at the low level.

Figure 13:
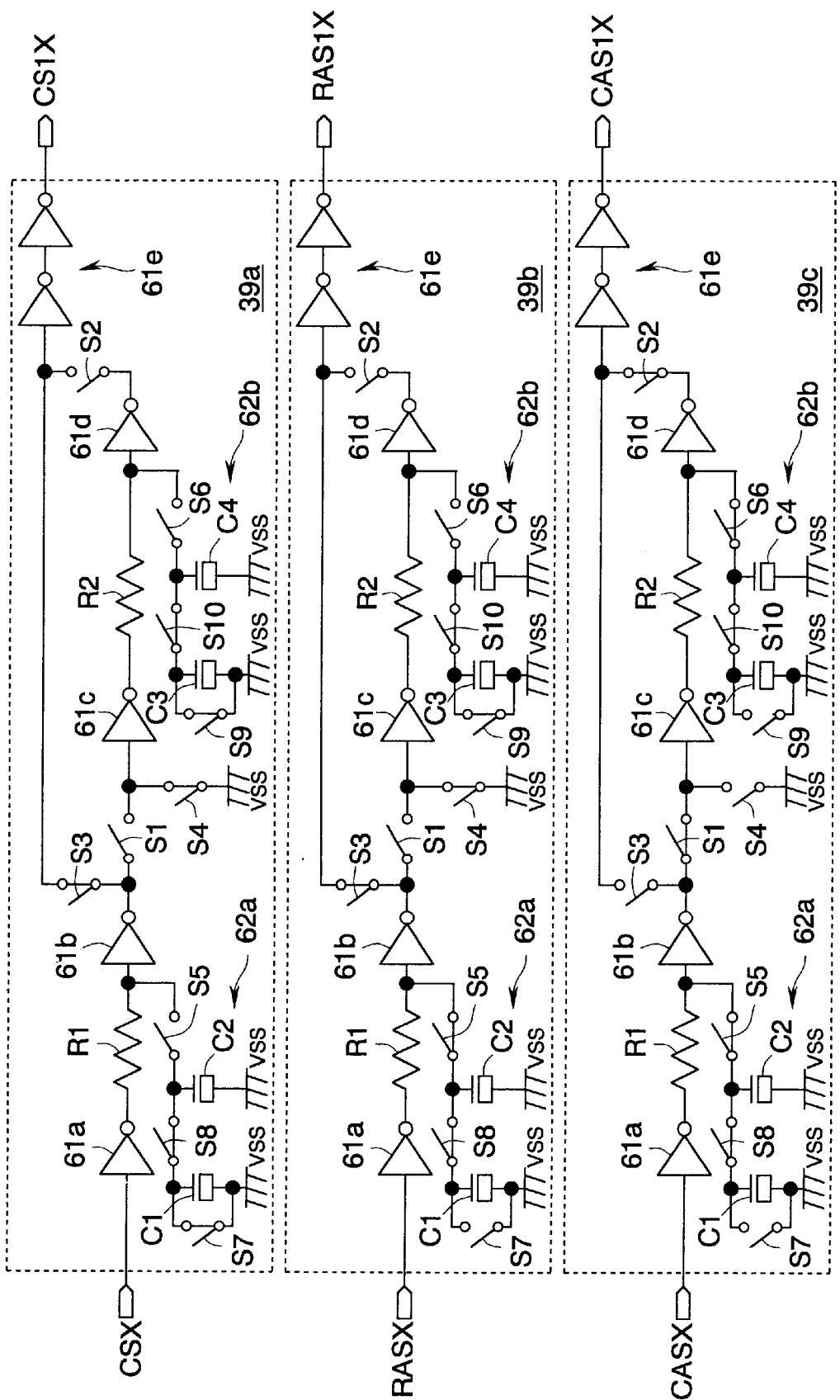
FIG. 13 is a circuit diagram showing the details of delay circuits in FIG. 10.

FIG. 13 shows the details of the delay circuits 39a, 39b, 39c.

Each of the delay circuits 39a, 39b, 39c is a circuit in which a plurality of inverters 61a, 61b, 61c, 61d, 61e are connected in cascade through resistors R1, R2 and switches S1–S10. The resistors R1, R2 are formed of diffusion resistances, wire resistances of polysilicon, or the likes.

In the delay circuit 39a, the output node of the inverter 61a is connected to the input node of the inverter 61b through the resistor R1. Next, the output node of the inverter 61b is connected to the input node of the inverter 61c through the switch S1. Subsequently, the output node of the inverter 61c is connected to the input node of the inverter 61d through the resistor R2. Finally, the output node of the inverter 61d is connected through the switch S2 to the input node of the inverter row 61e in which two inverters are connected in cascade. The inverter row 61e outputs the delay signal CS1X. The output node of the inverter 61b is also connected to the input node of the inverter row 61e through the switch S3. Further, the input node of the inverter 61c is connected to the ground VSS through the switch S4. Still further, a capacitor part 62a is connected to the input node of the inverter 61b through the switch S5. Likewise, a capacitor part 62b is connected to the input node of the inverter 61d through the switch S6. Herein, the capacitor part 62a is configured of MOS capacitors C1, C2, in each of which the source and drain of an nMOS are connected to the ground VSS, and the switches S7, S8. On the other hand, the capacitor part 62b is configured of MOS capacitors C3, C4 and the switches S9, S10. The gate of the MOS capacitor C1 is connected to the ground VSS through the switch S7. Moreover, the gates of the MOS capacitors C1, C2 are interconnected through the switch S8. Likewise, the gate of the MOS capacitor C3 is connected to the ground VSS through the switch S9. Moreover, the gates of the MOS capacitors C3, C4 are interconnected through the switch S10.

Modifying the wiring pattern of a wiring mask for the uppermost layer makes it possible to turn ON or OFF each of the switches S1–S10. Each of the delay circuits 39b, 39c is the same circuit as the delay circuit 39a except the ON and OFF states of the switches S1–S10. In this embodiment, in the delay circuit 39a, the switches S1, S2, S5, S6 are turned OFF, and the switches S3, S4, S7, S8, S9, S10 are turned ON. Also, in the delay circuit 39b, the switches S1, S2, S6, S7 are turned OFF, and the switches S3, S4, S5, S8, S9, S10 are turned ON. Besides, in the delay circuit 39c, the switches S3, S4, S7, S9 are turned OFF, and the switches S1, S2, S5, S6, S8, S10 are turned ON.

That is, in the delay circuit 39a, neither of the capacitor parts 62a, 62b is connected to the transmission path of the internal signal CSX. In the delay circuit 39b, only the capacitor part 62a is connected to the transmission path of the internal signal RASX. In the delay circuit 39c, both the capacitor parts 62a, 62b are connected to the transmission path of the internal signal CASX. As a result, the delay times are in the relationship of (delay circuit 39a)<(delay circuit 39b)<(delay circuit 39c).

Incidentally, the delay circuits 39a, 39b, 39c can set, at most, 18 sorts of delay times in accordance with the ON and OFF states of the switches S1–S10.

Figure 14:
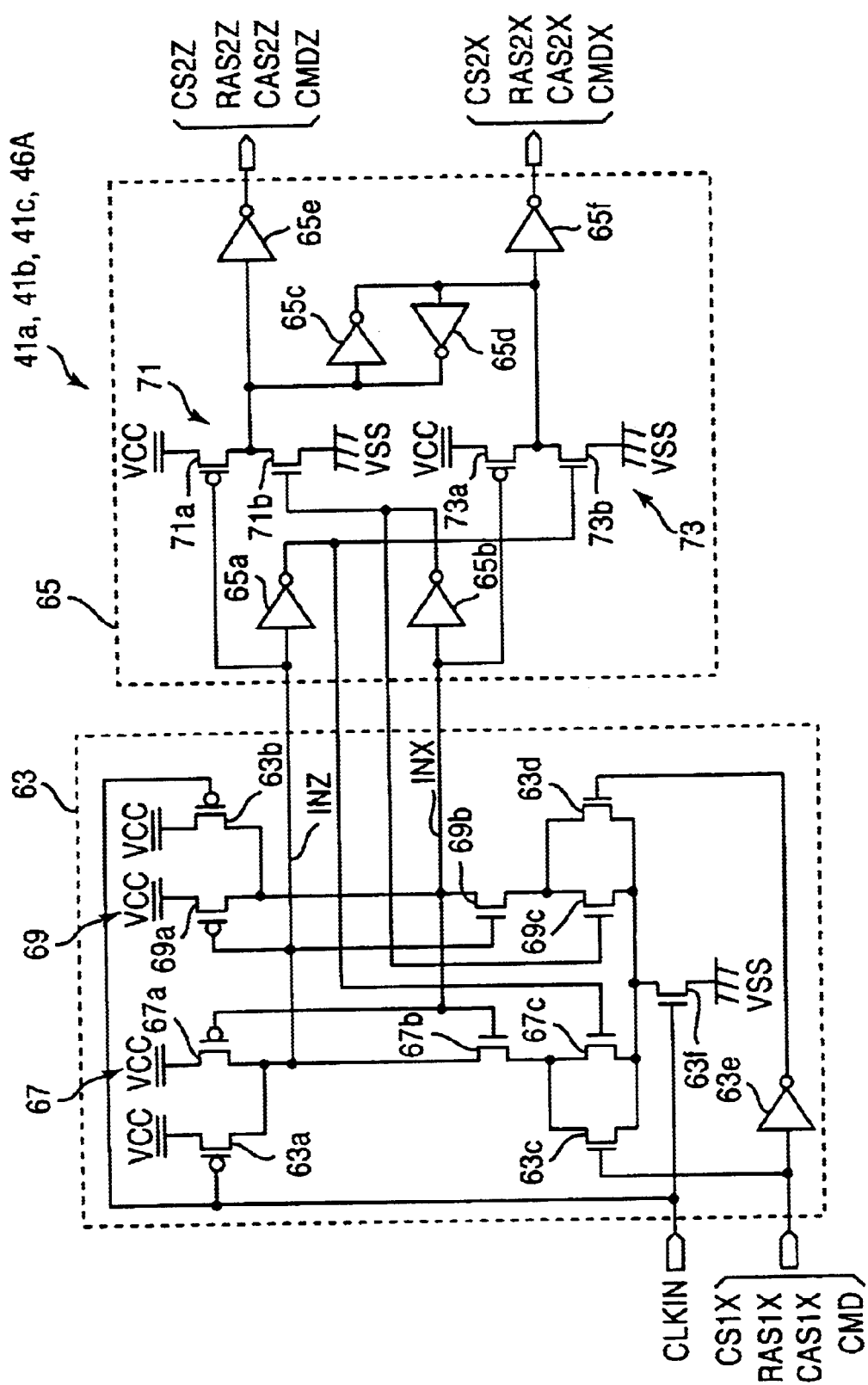
FIG. 14 is a circuit diagram showing the details of each of latches and a command latch in FIG. 10.

FIG. 14 shows the details of each of the latches 41a, 41b, 41c and command latch 46A.

Each of the latches 41a, 41b, 41c and command latch 46A is configured of a signal accepting unit 63 and a signal outputting unit 65.

In the signal accepting unit 63, there are symmetrically arranged a latching unit 67 in which a pMOS 67a and nMOSs 67b, 67c are connected in series, and a latching unit 69 in which a pMOS 69a and nMOSs 69b, 69c are connected in series. An accepted signal INZ is output from the drains of the pMOS 67a and nMOS 67b. An accepted signal INX is supplied to the gates of the pMOS 67a and nMOS 67b. Likewise, the accepted signal INX is output from the drains of the pMOS 69a and nMOS 69b. The accepted signal INZ is supplied to the gates of the pMOS 69a and nMOS 69b. The sources of the pMOSs 67a, 69a are connected to the power supply VCC. Further, the drains of pMOSs 63a, 63b, the sources of which are connected to those of the pMOSs 67a, 69a, are connected to the drains of the pMOSs 67a, 69a, respectively. Still further, the output nodes of the inverters 65a, 65b of the signal outputting unit 65 to be explained later are connected to the gates of the nMOSs 67c, 69c, respectively.

The internal clock signal CLKIN is supplied to the gates of the pMOSs 63a, 63b and an nMOS 63f. The drains of nMOSs 63c, 63d, the sources of which are connected to the ground VSS through the nMOS 63f, are connected to the drains of the nMOSs 67c, 69c, respectively. Any of the delay signals CS1X, RAS1X, CAS1X and command signal CMD is supplied to the gate of the nMOS 63c. Also, any of the delay signals CS1X, RAS1X, CAS1X and command signal CMD as inverted by an inverter 63e is supplied to the gate of the nMOS 63d. The sources of the nMOSs 67c, 69c are connected to the ground VSS through the nMOS 63f.

The signal accepting unit 63 has the functions of receiving the rising edge of the internal clock signal CLKIN and activating the latching units 67, 69, accepting any of the delay signals CS1X, RAS1X, CAS1X and command signal CMD to output the accepted signals INX, INZ to the signal outputting unit 65.

The signal outputting unit 65 is configured of an outputting circuit 71 which consists of a pMOS 71a and an nMOS 71b, an outputting circuit 73 which consists of a pMOS 73a and an nMOS 73b, the inverters 65a and 65b, inverters 65c and 65d whose input nodes and output nodes are connected to each other, and inverters 65e and 65f. The gates of the pMOSs 71a, 73a are supplied with the accepted signals INZ, INX, respectively. The sources of the pMOSs 71a, 73a are connected to the power supply VCC. In addition, the output nodes of the inverters 65b, 65a are connected to the gates of the nMOSs 71b, 73b, respectively. Besides, the sources of the nMOSs 71b, 73b are connected to the ground VSS. The output node of the outputting circuit 71 is connected to the input nodes of the inverters 65c, 65e. On the other hand, the output node of the outputting circuit 73 is connected to the input nodes of the inverters 65d, 65f. Thus, any of the internal signals CS2Z, RAS2Z, CAS2Z and the command signal CMDZ is output from the inverter 65e. Also, any of the internal signals CS2X, RAS2X, CAS2X and the command signal CMDX is output from the inverter 65f.

The signal outputting unit 65 has the functions of receiving the accepted signals INX, INZ in the outputting circuits 71, 73 and latching them in the inverters 65c, 65d, and then outputting any of the internal signals CS2Z, RAS2Z, CAS2Z corresponding to the above accepted signals and the command signal CMDZ and any of the internal signals CS2X, RAS2X, CAS2X corresponding to the above accepted signals and the command signal CMDX.

Figure 15:
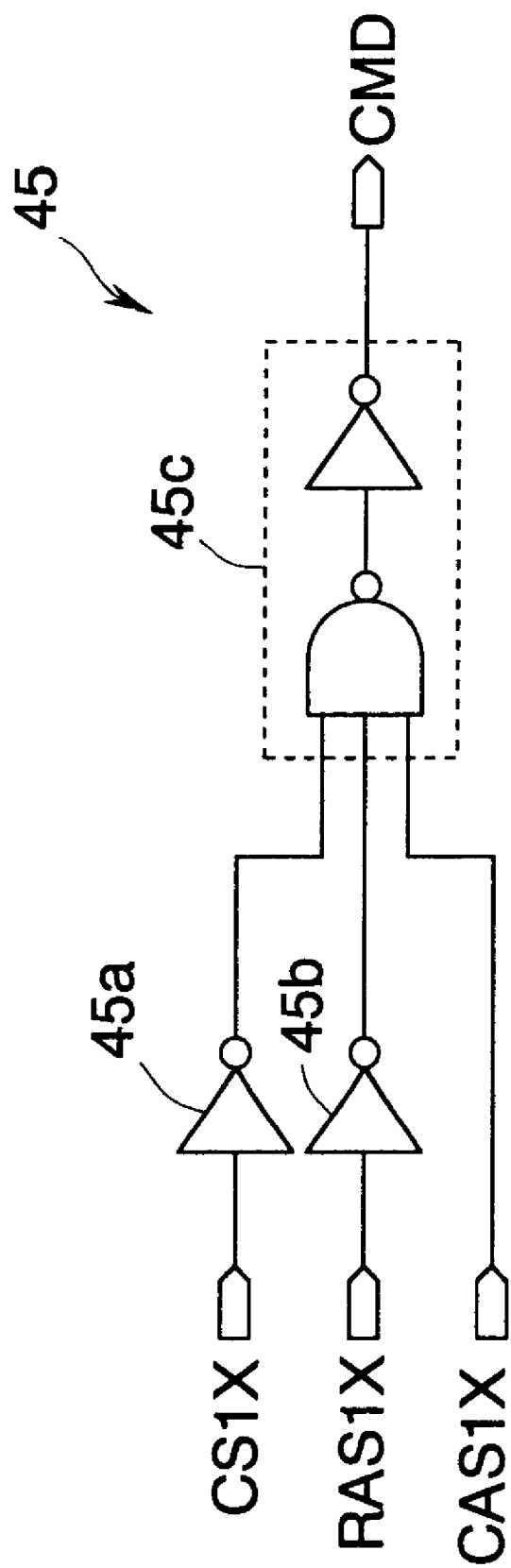
FIG. 15 is a circuit diagram showing the details of a command decoder in FIG. 10.

FIG. 15 shows the details of the command decoder 45. The command decoder 45 is configured of inverters 45a, 45b and a 3-input AND circuit 45c. The inverter 45a is supplied with the delay signal CS1X. The inverter 45b is supplied with the delay signal RAS1X. The input nodes of the AND circuit 45c are supplied with the outputs of the inverters 45a, 45b and the delay signal CAS1X. The AND circuit 45c outputs the command signal CMD. In this embodiment, the command decoder 45 brings the command signal CMD to the high level when the chip select signal /CS, row address strobe signal /RAS and column address strobe signal /CAS supplied to the input interfacing unit (21 in FIG. 9) have the low level, low level and high level, respectively. Thus, the command latch 46A shown in FIG. 14 operates to latch the command signal CMD and to output the command signals CMDZ, CMDX to the controlling unit 23 (refer also to FIG. 10). Then, the controlling unit 23 executes a predetermined command input process.

In the SDRAM described above, the input interfacing unit 21 accepts the signals supplied from the exterior of the SDRAM and outputs the accepted signals to the controlling unit 23 as will be explained below.

Figure 16:
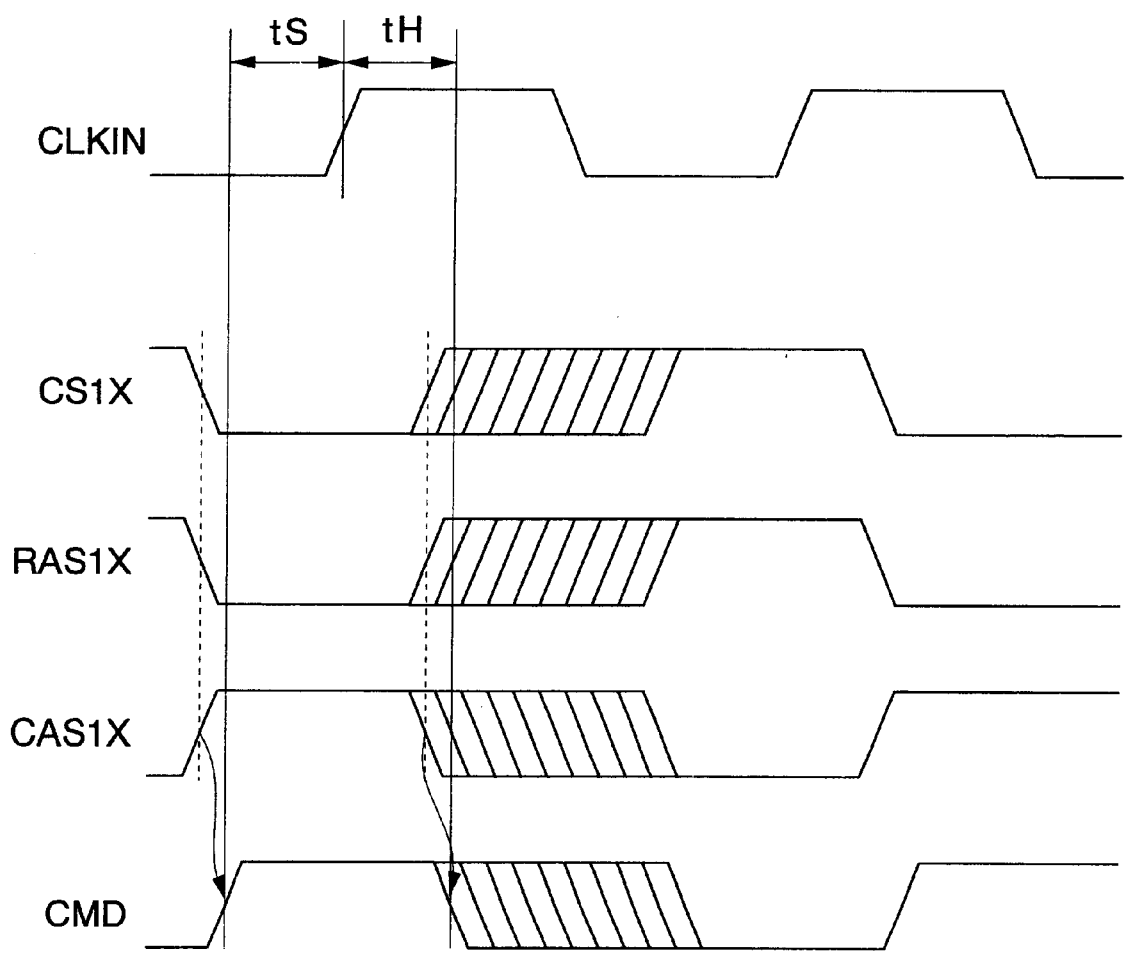
FIG. 16 is a timing chart showing the decoding timings of internal signals and the accepting timing of a decoded signal.

The chip select signal /CS, row address strobe signal /RAS and column address strobe signal /CAS supplied from the exterior of the SDRAM are converted into gay the internal signals CSX, RASX and CASX by the input buffers 37 of the input circuits 33b, 33c and 33d shown in FIG. 10, respectively. The internal signals CSX, RASX and CASX are respectively supplied to the delay circuits 39a, 39b and 39c. Subsequently, the delay signals CS1X, RAS1X and CAS1X obtained by delaying the internal signals CSX, RASX and CASX the predetermined time periods are output from the delay circuits 39a, 39b and 39c. As shown in FIG. 13, the delay times of the respective delay circuits 39a, 39b and 39c can be finely adjusted by the switches S1–S10, and they are adjusted so that the timings of each delay signals CS1X, RAS1X and CAS1X arriving at the command decoder 45 may coincide. Consequently, the delay signals CS1X, RAS1X and CAS1X at the input node of the command decoder 45 have the same timings as shown in FIG. 16. Moreover, the set-up time tS and the hold time tH of the command signal CMD output from the command decoder 45 shown in FIG. 10, with respect to the internal clock signal CLKIN, are equalized. That is, the timing margins for the set-up time tS and the hold time tH are maximized. Thereafter, the command latch 46A outputs the accepted command signal CMD to the controlling unit 23 as the command signals CMDZ, CMDX. Since the command signal CMD is generated without the intervention of any of the latches 41a, 41b and 41c, the output timing thereof is advanced. It is therefore possible to advance the control timing of the controlling unit 23.

Besides, the delay signals CS1X, RAS1X and CAS1X are supplied to the latches 41a, 41b and 41c and accepted thereinto at the rise of the internal clock signal CLKIN, respectively. The latches 41a, 41b and 41c are arranged at positions near the command decoder 45. Therefore, the timing margins of each of the latches 41a, 41b and 41c for the set-up time tS and the hold time tH with respect to the internal clock signal CLKIN are substantially equalized to the timing margins of the command latch 46A. To be exact, the timing of each of the delay signals CS1X, RAS1X and CAS1X shifts in correspondence with the number of gates (three stages) of the command decoder 45, but the shifting magnitude lies within an allowable range. The accepted delay signals CS1X, RAS1X and CAS1X are respectively output to the controlling unit as the internal signals CS2Z as well as CS2X, RAS2Z as well as RAS2X, and CAS2Z as well as CAS2X. Accordingly, the timing margins of the set-up times tS and the hold times tH to the latches 41a, 41b and 41c and the internal clock signal CLKIN of the command latch 46A for are sufficiently given by the delay circuits 39a, 39b and 39c respectively formed in the input circuits 33b, 33c and 33d.

In the semiconductor integrated circuit constructed as described above, the internal signals CS1X, RAS1X and CAS1X delayed the predetermined time periods by the respective delay circuits 39a, 39b and 39c are output to the command decoder 45. Therefore, the timings at which the internal signals CS1X, RAS1X and CAS1X arrive at the command decoder 45 can be caused to coincide. As a result, the command decoder 45 can output the command signal CMD of large pulse width. Accordingly, the command latch 46A can accept the command signal CMD while the set-up time tS and the hold time tH with respect to the internal clock signal CLKIN are ensured sufficiently.

The command signal CMD is generated in such a way that the internal signals CS1X, RAS1X and CAS1X output from the respective delay circuits 39a, 39b and 39c are directly received by the command decoder 45. Therefore, the output timing of the command signal CMD can be advanced to start the operation of the controlling unit 23 earlier.

The latches 41a, 41b and 41c and the command accepting circuit 43A are arranged at the near positions within the accepting unit 29. Therefore, the timings at which the internal signals CS1X, RAS1X and CAS1X arrive at the respective latches 41a, 41b and 41c and the command latch 46A of the command accepting circuit 43A become substantially coincident. In the respective latches 41a, 41b and 41c, accordingly, the timing margins of the internal signals CS1X, RAS1X and CAS1X for the set-up times tS and the hold times tH with respect to the internal clock signal CLKIN can be substantially equalized to the timing margins of the command signal CMD in the command latch 46A. That is, the acceptance timings of both the latches 41a, 41b and 41c and the command latch 46A can be ensured by only the delay circuits 39a, 39b and 39c respectively formed in the input circuits 33b, 33c and 33d.

The input signals (/CS, /RAS and /CAS) received from the exterior of the SDRAM are transmitted through the respective delay circuits 39a, 39b and 39c, and the resulting signals are thereafter distributed to the respective latches 41a, 41b and 41c and the command accepting circuit 43A as the internal signals CS1X, RAS1X and CAS1X. Therefore, the number of the delay circuits 39a, 39b and 39c can be minimized. In consequence, the size of the chip can be made smaller.

The delay time of each of the delay circuits 39a, 39b and 39c can be modified by changing the transmission path of the signal in accordance with the ON/OFF states of the switches S1–S10. Therefore, the optimum delay time can be set for each of the delay circuits 39a, 39b and 39c. Even in a case where the adjustment of the delay time has become necessary, the delay time can be modified merely by changing the ON/OFF states of the switches S1–S10. Moreover, in case of making the layout designs of each delay circuits 39a, 39b and 39c, the layout data of the elements other than the switches S1–S10 can be made common, so that the layout designing time can be shortened.

Figure 17:
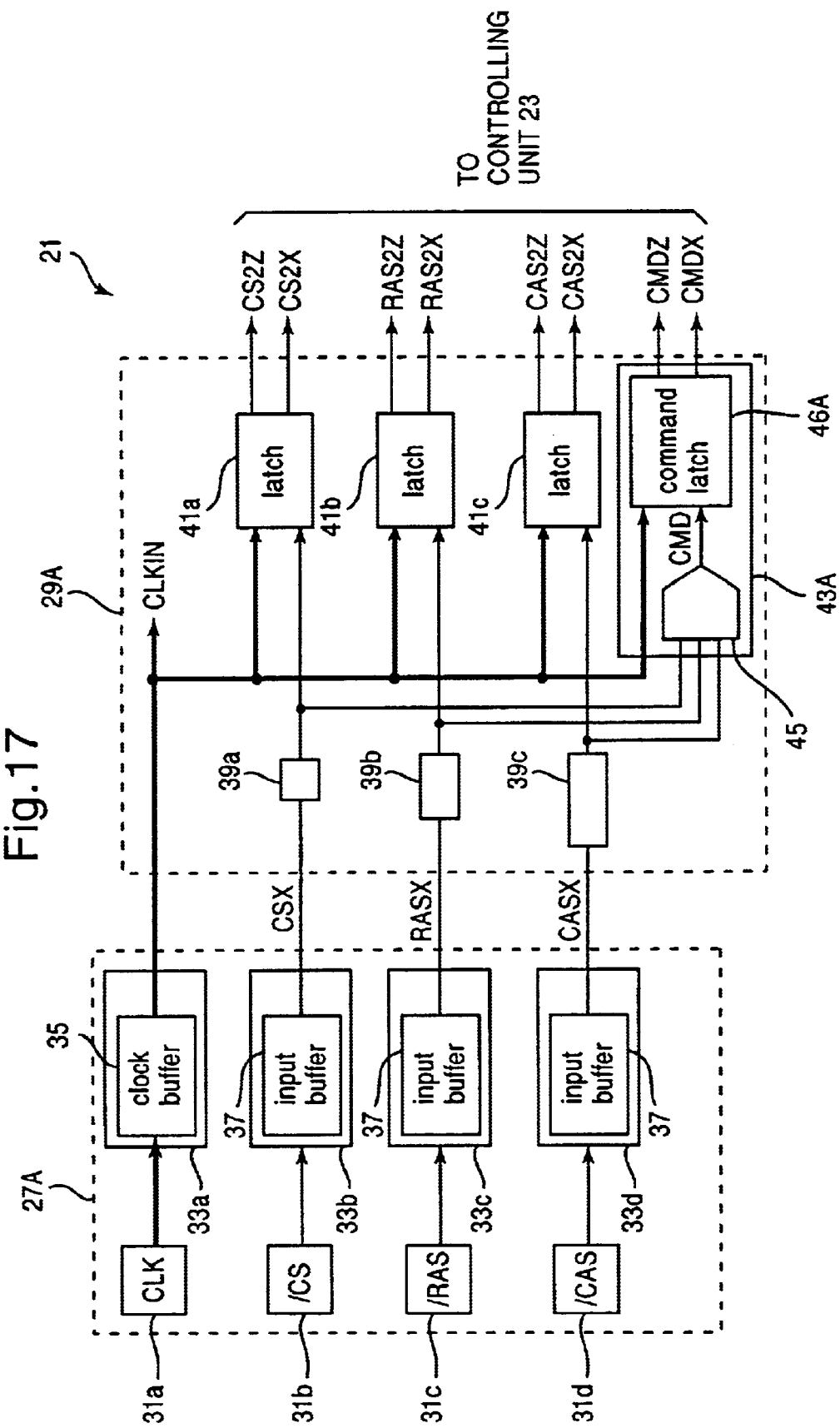
FIG. 17 is a block diagram showing the second embodiment of the semiconductor integrated circuit according to the present invention.

FIG. 17 shows the second embodiment of the semiconductor integrated circuit according to the present invention.

In this embodiment, delay circuits 39a, 39b, 39c are respectively arranged within an accepting unit 29A. The remaining construction of this embodiment is the same as in the first embodiment described before.

With this embodiment, effects similar to those of the first embodiment described before can be attained. Furthermore, since the delay circuits 39a, 39b, 39c are arranged within the accepting unit 29 in this embodiment, they can be located at near positions. As a result, the connections of the switches S1–S10 can be easily confirmed on a wiring mask by way of example.

Incidentally, the foregoing embodiments have been exemplified as adjusting the delay times in the way that the switches S1–S10 of the delay circuits 39a, 39b, 39c are turned ON or OFF by changing the wiring patterns of the wiring masks at the uppermost layer. The present invention, however, is not restricted to such an aspect of performance. For example, the delay times may well be adjusted in the way that the switches S1–S10 are formed of transmission gates made of MOS transistors, and that the transmission gates are controlled to turn ON or OFF. Alternatively, the delay times may well be adjusted in the way that the switches S1–S10 are formed of fuses made of polysilicon or the like, and that some of the fuses are blown as are necessary. In the case where the switches S1–S10 are formed of the fuses, the blowing of the fuses can be efficiently carried out by arranging the delay circuits 39a, 39b, 39c at the near positions as shown in the second embodiment.

The foregoing embodiments have been exemplified as forming the delay circuits 39a, 39b, 39c by the use of the resistors R1, R2 and the MOS capacitors C1, C2, C3, C4. The present invention, however, is not restricted to such an aspect of performance. For example, each delay circuit may well be formed by meandering a wiring pattern which has the same width as that of the wiring pattern of the internal clock signal CLKIN. In this case, the total of the lengths of the wiring pattern of each delay circuit and the wiring pattern of, for example, the delay signal CS1X laid to the latch 41a is equalized to the length of the wiring pattern of the internal clock signal CLKIN laid to the latch 41a. It is consequently possible to maximize the timing margins of the delay signal CS1X for the set-up time tS and the hold time tH with respect to the internal clock signal CLKIN.

The invention is not limited to the above embodiments and various modifications may be made without departing from the spirit and the scope of the invention. Any improvement may be made in part or all of the components.

Figure 18:
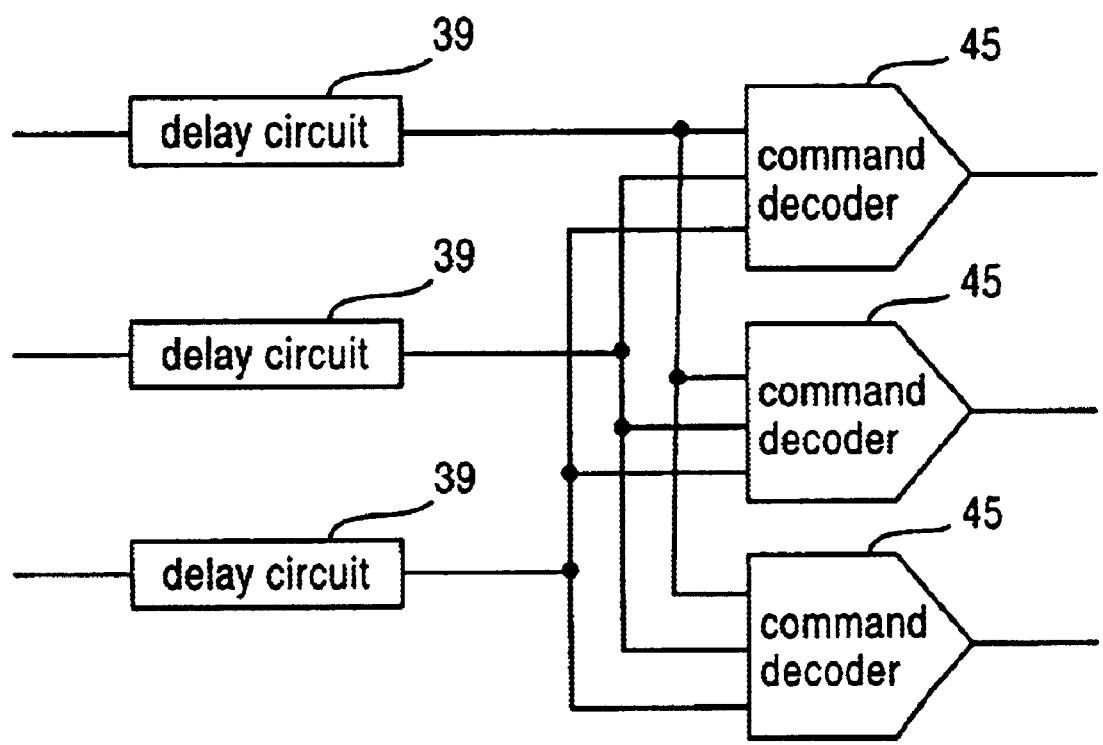
FIG. 18 is a block diagram of a configuration of plurality of command deciders having common delay circuits according to the present invention.

FIG. 18 illustrates a configuration of a plurality of command decoders having commonly disposed delay circuits according to another embodiment of the present invention. Common delay circuits 39 are disposed between input pads (not shown) and command decoders 45. Each delay circuit 39 receives an input control signal and outputs a delayed control signal command to the command decoders 45. As a result of this configuration, the number of delay circuits may be reduced as well as the size of the chip. In other words, rather than having plural delay circuits 39 for each command decoder 45, a circuit 39 is disposed commonly for each of command decoders 45.

What is claimed is:

1. A semiconductor integrated circuit comprising:
    a plurality of pads for receiving control signals to control an operation of an internal circuit, respectively;
    a plurality of command decoders; and
    a plurality of delay circuits having respective fixed delay times, disposed commonly to said plurality of command decoders, and coupled between said plurality of pads and said plurality of command decoders, for delaying said control signals by the respective delay times,
    wherein said plurality of command decoders receive and decode output signals from said delay circuits to output command signals.

2. A semiconductor integrated circuit according to claim 1, further comprising command latch circuits for latching said command signals in response to a clock signal.

3. A semiconductor integrated circuit according to claim 1, wherein a plurality of connection lines between said plurality of pads and said delay circuits have lengths different from each other.

4. A semiconductor integrated circuit according to claim 1, wherein said output signals from said delay circuits are outputted at substantially the same timing.

5. A semiconductor integrated circuit according to claim 1, wherein said delay circuits have a plurality of delay units corresponding to said plurality of pads, and delay times of said delay units are different from each other.

6. A semiconductor integrated circuit comprising:
    a plurality of pads for receiving control signals respectively;
    a plurality of delay circuits for delaying said control signals respectively;
    a plurality of receiver circuits for respectively receiving delayed control signals output from said delay circuits in synchronization with a clock signal; and
    a command decoder for receiving more than one of said delayed control signals and for outputting a command signal to control an operation of an internal circuit.

7. A semiconductor integrated circuit according to claim 6, further comprising
    a command signal receiver circuit for receiving, in synchronization with said clock signal, said command signal output from said command decoder.

8. A semiconductor integrated circuit according to claim 6, wherein said each delay circuit comprises a switch which changes a transmission path of said control signal to adjust a delay time of said each delay circuit, and wherein
    said delay time of said each delay circuit is respectively adjusted so that supply timings to said command decoder are equal between each said control signal.

9. A semiconductor integrated circuit according to claim 6, wherein a plurality of connection lines between said plurality of pads and said plurality of delay circuits have lengths different from each other.

10. A semiconductor integrated circuit according to claim 9, wherein said delayed control signals are outputted from said delay circuits at substantially a same timing.

11. A semiconductor integrated circuit according to claim 6, wherein a plurality of connection lines between said plurality of delay circuits and said command decoder have lengths different from each other.

12. A semiconductor integrated circuit comprising:
    a plurality of pads for receiving control signals respectively;
    a plurality of command decoders for generating command signals to control an operation mode of the integrated circuit; and
    a plurality of delay circuits having respective delay times, disposed commonly to said plurality of command decoders, and coupled between said plurality of pads and said plurality of command decoders, for delaying said control signals the respective delay times,
    wherein said plurality of command decoders receive and decode output signals from said delay circuits to output command signals.

13. A semiconductor integrated circuit according to claim 12, further comprising command latch circuits for latching said command signals in response to a clock signal.

14. A semiconductor integrated circuit according to claim 12, wherein a plurality of connection lines between said plurality of pads and said delay circuits have lengths different from each other.

15. A semiconductor integrated circuit according to claim 12, wherein said output signals from said delay circuits are outputted at substantially the same timing.

16. A semiconductor integrated circuit according to claim 12, wherein said delay circuits have a plurality of delay units corresponding to said plurality of pads, and delay times of said delay units are different from each other.

* * * * *